United States Patent [19]
Shirai et al.

[11] Patent Number: 5,898,516
[45] Date of Patent: Apr. 27, 1999

[54] FARADAY ROTATOR HAVING A RECTANGULAR SHAPED HYSTERESIS

[75] Inventors: Kazushi Shirai; Norio Takeda; Kiyonari Hiramatsu, all of Tokyo, Japan

[73] Assignee: Mitsubishi Gas Chemical Company, Inc., Tokyo, Japan

[21] Appl. No.: 08/867,497

[22] Filed: Jun. 2, 1997

[30] Foreign Application Priority Data

Jun. 3, 1996 [JP] Japan .................................. 8-140020

[51] Int. Cl.$^6$ ......................................................... G02F 1/00
[52] U.S. Cl. ............................................ 359/324; 359/321
[58] Field of Search .................................. 359/321, 324, 359/280–283

[56] References Cited

U.S. PATENT DOCUMENTS 4,981,341   1/1991   Brandle, Jr. et al. ................... 359/321

FOREIGN PATENT DOCUMENTS 647 869   4/1995   European Pat. Off. .

OTHER PUBLICATIONS

"Bi–Substituted Magnetic Garnet Film and Its Application to an Optical Isolator" by Uchishiba et al, Fujitsu–Scientific and Technical Journal, vol. 26, No. 2, Jan. 1990, p. 123.

"Magnetic and Magneto–Optic Properties of Bismuth– and Aluminum–Substituted Iron Garnet Films" Journal of Applied Physics, Feb. 1984 vol. 55, No. 4, pp. 1052–1061.

Patent Abstracts of Japan, Pub. No. 09033871, Feb. 1997.

Patent Abstracts of Japan, Pub. No. 06222311, Aug. 1994.

*Primary Examiner*—Georgia Epps
*Assistant Examiner*—Dawn-Marie Bey
*Attorney, Agent, or Firm*—Sughrue, Mion, Zinn, Macpeak & Seas, PLLC

[57] ABSTRACT

A Faraday rotator is formed of a bismuth-substituted iron garnet single crystal film grown by a liquid phase epitaxial method. The single crystal film is represented by a formula: $Tb_{3-x}Bi_xFe_{5-y-z}Ga_yAl_zO_{12}$ wherein x has the range $1.1 \leq x \leq 1.5$, y+z has the range $0.65 \leq y+z \leq 1.2$, and z has the range $z \leq y$. The bismuth-substituted rare earth single crystal film is subjected to a magnetization process where the single crystal film is magnetized by an external magnetic field so that the film has a square magnetic hysteresis loop. The external magnetic field has a magnetic field strength of 1,000 Oe or higher and is applied in a direction normal to a surface of the bismuth-substituted rare earth iron garnet single crystal film.

5 Claims, 2 Drawing Sheets

FARADAY ROTATOR HAVING A RECTANGULAR SHAPED HYSTERESIS

BACKGROUND OF THE INVENTION

1. Field of the Invention

The present invention relates to a rare earth iron garnet single crystal film which has very high magnetic hysteresis, and more particularly to a bismuth-substituted rare earth iron garnet single crystal film having saturation magnetic field higher than its nucleation field over a wide range of its practical operating temperatures. Such a single crystal film functions properly as a Faraday rotator without an external magnetic field applied thereto and is therefore suitable for an optical isolator.

2. Description of Related Art

In recent years, the research of optical isolators, optical switches, and magneto-optic sensors which use a bismuth-substituted rare earth iron garnet single crystal film has been intensively carried out. Faraday effect is a magneto-optic effect in which the plane of polarization of light is rotated when the light passes through a Faraday element that exhibits the Faraday effect, i.e., a Faraday rotator made of a material such as bismuth-stubstituted rare earth iron garnet single crystal films.

In general, the Faraday rotation angle increases with the intensity of an external magnetic field applied to the Faraday rotator.

FIG. 1 is a model representation of a magnetic property of a bismuth-substituted rare earth iron garnet single crystal film having no hysteresis. As shown in FIG. 1, a bismuth substituted rare earth iron garnet single crystal film exhibits a saturated rotation angle when the external magnetic field exceeds a certain level. The magnetic field strength at which the Faraday rotation reaches a constant value is referred to as saturation magnetic field (Hs). Then, the Faraday rotation decreases with decreasing intensity of the external magnetic field, and becomes zero when the magnetic field becomes zero. In other words, the Faraday rotation traces a path o-a-b-c-b-a-o.

Actually, the Faraday rotation shows some magnetic hysteresis so that the Faraday rotation traces a path o-a-b-c-b'-a-o as shown in FIG. 1. There has been found a phenomenon that some bismuth-substituted rare earth iron garnet single crystal films having a chemical formula [(YBi)$_3$(FeAl)$_5$O$_{12}$] retain saturated Faraday rotation angles even if an external magnetic field is applied which is of substantially the same strength but of an opposite direction to the magnetic field by which the single crystal films were magnetically saturated, i.e., the magnetization curve follows the path o-a-b-c-b-d-e-f-e (Journal of Applied Physics, Vol. 55(1984), pp1052–1061).

FIG. 2 is a model representation of a magnetic property of a bismuth-substituted rare earth iron garnet single crystal film having a large square magnetic hysteresis loop that exceeds the saturation magnetic fried (Hs).

Referring to FIG. 2, the magnetic field strength at which the Faraday rotation angle is inverted in polarity is referred to as nucleation field (Hn). The difference between the Hs and Hn is the size of magnetic hysteresis.

A hysteresis curve of magnetization having large magnetic hysteresis such as that shown in FIG. 2 is referred to as square hysteresis loop.

Magneto-optic materials having a square magnetic hysteresis loop serve as a Faraday rotator that shows the Faraday effect even when no external magnetic field is applied thereto. Thus, a bismuth-substituted rare earth iron garnet single crystal film having a square hysteresis loop, when used as a Faraday rotator, does not need a permanent magnet which is usually required when manufacturing an optical isolator. Thus, such a film lends itself to miniaturizing the device and minimizing the cost of the optical isolator.

The inventors of the present invention found that the (GdYBi)$_3$(FeGa)$_5$O$_{12}$ developed as a bismuth-substituted rare earth iron garnet single crystal film for optical switches exhibits a square hysteresis loop, and investigated the crystal film to determine whether the material could be used as a magnet-free Faraday rotator for optical isolators.

The inventors investigated the characteristics of a (GdYBi)$_3$(FeGa)$_5$O$_{12}$ single crystal film, and found a problem that the material exhibits a square hysteresis loop at temperatures near room temperature but even a weak external magnetic field applied to the material is enough to cause the square hysteresis to disappear or to cause the Faraday rotation angle to get out of saturation at temperatures higher than +50° C.

The inventors conducted research on the bismuth-substituted rare earth iron garnet single crystal film proposed in Japanese Patent Preliminary Publication (KOKAI) No. 6-222311, and found that the material magnetically saturated in one direction showed a Faraday rotation angle of an inverted polarity when placed in an external magnetic field of about 50 Oe in the opposite direction, and the material could maintain the square hysteresis only over a narrow temperature range.

Optical isolators are usually used in an environment of temperatures in the range from −20 to +50° C. In addition, some external magnetic field may exist near the location where an optical isolator is installed. Thus, it is required that the material retains its saturated Faraday rotation angle when the material is placed in external magnetic fields up to 50 Oe and preferably 100 Oe.

SUMMARY OF THE INVENTION

In order to solve the aforementioned drawbacks, the inventors further investigated the material and arrived at the present invention.

A Faraday rotator of the invention is formed of a bismuth-substituted iron garnet single crystal film grown by a liquid phase epitaxial method and represented by a formula:

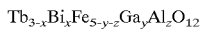

$$Tb_{3-x}Bi_xFe_{5-y-z}Ga_yAl_zO_{12}$$

wherein x has the range $1.1 \leq x \leq 1.5$, y+z has the range $0.65 \leq y+z \leq 1.2$, and z has the range $z \leq y$.

The bismuth-substituted rare earth single crystal film is subjected to a magnetization process where the single crystal film is magnetized by a first external magnetic field and has a square magnetic hysteresis loop.

The first external magnetic field has a magnetic field strength of 1,000 Oe or higher and is applied in a direction normal to a surface of the bismuth-substituted rare earth iron garnet single crystal film.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DESCRIPTION OF THE PREFERRED EMBODIMENTS

Figure 1:
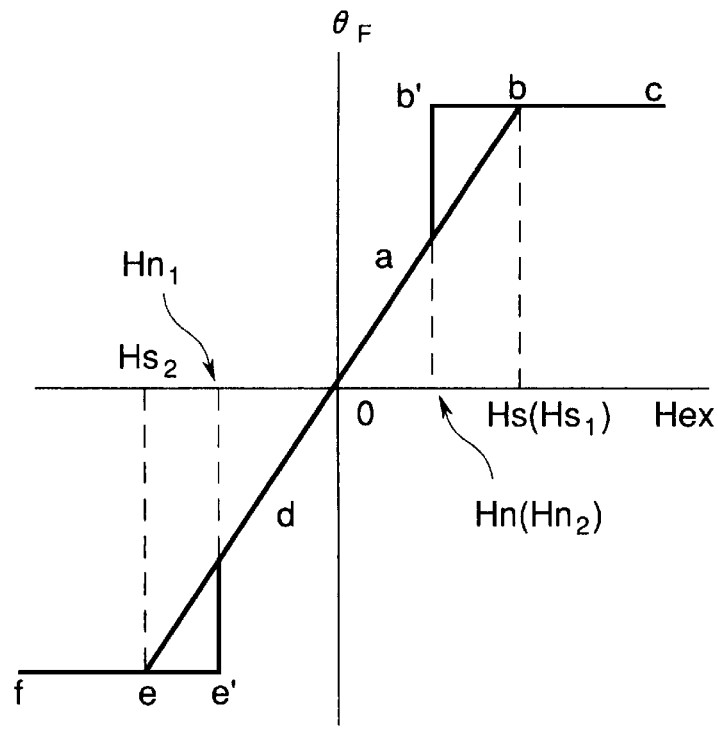
FIG. 1 is a model representation of a magnetic property of a bismuth-substituted rare earth iron garnet single crystal film having no hysteresis.
Figure 2:
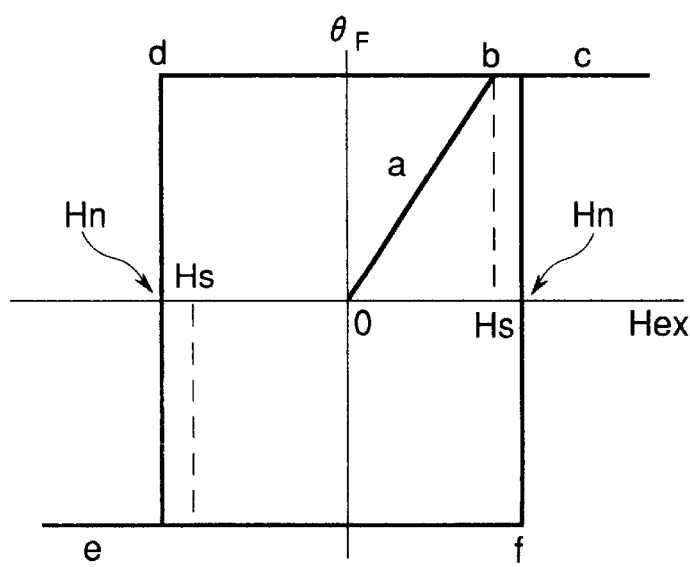
FIG. 2 is a model representation of a magnetic property of a bismuth-substituted rare earth iron garnet single crystal film having square hysteresis.

Faraday rotator according to the present invention is a square hysteresis type Faraday rotator formed of a bismuth-substituted rare earth iron garnet single crystal film which is manufactured by a liquid-phase epitaxial (LPE) method and is magnetized. The material is defined by the following chemical structural formula.

$$Tb_{3-x}Bi_xFe_{5-y-z}Ga_yAl_zO_{12} \quad (1)$$

where x has the range $1.1 \leq x \leq 1.5$, y+z has the range 1.5, $0.65 \leq y+z \leq 1.2$, and z has the range $z \leq y$.

In the present invention, when magnetizing the bismuth-substituted rare earth iron garnet single crystal film into saturation to have a square hysteresis loop, an external magnetic field higher than 1,000 Oe is preferably applied to magnetize the material. It has not been fully analyzed why an external magnetic higher than 1,000 Oe is preferable but it seems to be due to the fact that the hysteresis becomes progressively Large with increasing external magnetic field applied to the material, yielding a material suitable for magnet-free optical isolators. In this specification, the term "magnetization process" is used to cover a process in which a strong magnetic field is applied to a material to bring the material into magnetic saturation so that the saturated material has large hysteresis. The term "reverse magnetization process" is used to cover a process in which the external magnetic field is reduced to zero after the material has been magnetically saturated and then an external magnetic field is applied to the material in a direction opposite to that of the magnetization process.

The square hysteresis is preferably retained in the temperature range from −40 to +70° C. and the polarity of Faraday rotation angle is preferably retained when an external magnetic field up to 50 Oe is applied to the material in a direction opposite to that of the magnetization process. These requirements should be fulfilled so that the Faraday rotator can reliably operate in a usual environment.

With the composition of a bismuth-substituted rare earth iron garnet single crystal film according to the present invention expressed by Formula (1), bismuth substitution amount x is preferably in the range given by $1.1 \leq x \leq 1.5$. A bismuth substitution amount x less than 1.1 is not desirable since the Faraday effect decreases and therefore the film needs to be thicker. A bismuth substitution amount x more than 1.5 causes the ion radius of bismuth to be large, being difficult to match the lattice of the film with a currently available substrate. This makes the manufacture of the Faraday rotator difficult.

A substitution amount y+z of gallium and aluminum is preferably in the range $0.65 \leq y+z \leq 1.2$. The substitution amount y+z less than 0.65 presents the problem that the square hysteresis loop cannot be retained over the temperature range in which the optical isolators are usually used or the problem that the reverse magnetization process causes the saturated Faraday rotation angle to disappear. The substitution amount y+z more than 1.2 reduces the Faraday effect with the result that a thicker film is needed to fabricate a Faraday rotator having the same Faraday effect. The proportion of gallium and aluminum should preferably be in the relation $y \geq z$.

Larger proportions of aluminum to gallium make it difficult to match the lattice with currently available substrates, being detrimental to the manufacture of Faraday rotators.

Garnet substrates used for growing a bismuth-substituted rare earth iron garnet single crystal film include a (111) garnet single crystal $[(GdCa)_3(GaMgZr)_5O_{12}]$ substrate having a lattice constant of 1.2497±0.0002 nm and a (111) garnet single crystal $[Nd_3Ga_5O_{12}]$ substrate having a lattice constant of 1.2509±0.0002 nm. These substrates are desirable from the standpoint of lattice matching.

EXAMPLES

The present invention will be described in detail by way of examples and comparisons with reference to the accompanying drawings.

Example 1

The following materials were placed in a platinum crucible of 2,000 ml capacity: 3,542 gm lead oxide (PbO, 4N), 3,733 gm bismuth oxide ($Bi_2O_3$, 4N), 448 gm ferric oxide ($Fe_2O_3$, 4N), 167 gm boron oxide ($B_2O_3$, 5N), 45.9 gm terbium oxide ($Tb_2O_3$, 3N), 66.7 gm gallium oxide ($Ga_2O_3$, 3N), and 5.8 gm aluminum oxide ($Al_2O_3$, 3N).

The materials were heated to melt, thereby preparing a melt for growing bismuth-substituted rare earth iron garnet single crystals.

A substrate or (111) garnet single crystal "$(GdCa)_3(GaMgZr)_5O_{12}$" was used to make a single crystal film, the substrate having a lattice constant of 1.2497±0.0002 nm. Using the usual method, one surface of the (111) garnet single crystal was brought into contact with the surface of the melt so as to perform epitaxial growth, thereby obtaining the $Tb_{1.63}Bi_{1.37}Fe_{4.01}Ga_{0.84}Al_{0.15}O_{12}$ single crystal film having a thickness of 365 μm (referred to as G-film-1). The composition of the single crystal film was analyzed by inductively coupled plasma emission spectrometry (LCP emission spectrometry).

The G-film-1 was polished to a thickness of 296 μm. The substrate was removed during polishing. Then, an anti-reflection film is formed on the both sides of the G-film-1 to fabricate a Faraday rotator (referred to as Faraday rotator 1) for light having a wavelength of 1.31 μM m. The magnetic properties of the G-film-1 were examined as follow:

First, Faraday rotator 1 was placed in the middle of a magnetic field generator having a Helmholtz coil, commercially available from Magnetics. Then, Faraday rotator 1 was exposed to a semiconductor laser having a wavelength of 1,310 nm while being placed in a magnetic field. The saturation magnetic field was determined by measuring the rotation angle of the plane of polarization of the laser light transmitted through Faraday rotator 1. Tn addition, the saturation magnetic field was measured at various ambient temperatures.

The saturation magnetic field of Faraday rotator 1 was 55 Oe at +25° C. and reached a maximum of 164 Oe in the temperature range from −40 to +70° C. Magnetic compensation temperature (temperature at which the magnetization becomes zero) was 0° C.

Then, Faraday rotator 1 was placed at the center of an electromagnet in an environment of 25° C. and a magnetic field of 2,000 Oe is applied in a direction normal to the film surface so that the film was magnetically saturated. Then, the magnetic field was reduced to zero after the film had been magnetically saturated. The Faraday rotator 1 was found to have retained the same Faraday rotation angle as that when Faraday rotator 1 was saturated by the electromagnet. The Faraday rotation angle was 44.7°.

In order to investigate the nucleation field of Faraday rotator 1, Faraday rotator 1 was again placed in the center of the Helmholtz coil of the field generator and a magnetic field was applied to the Faraday rotator 1 in a direction opposite to the direction of the external magnetic field applied by the electromagnet. In other words, a test was conducted to determine a maximum external magnetic field under which the Faraday rotator 1 can retain its magnetic saturation. Faraday rotator 1 was found to have retained its magnetic saturation tinder a maximum magnetic field of 143 Oe in the temperature range of −40 to +70° C.

Figure 3:
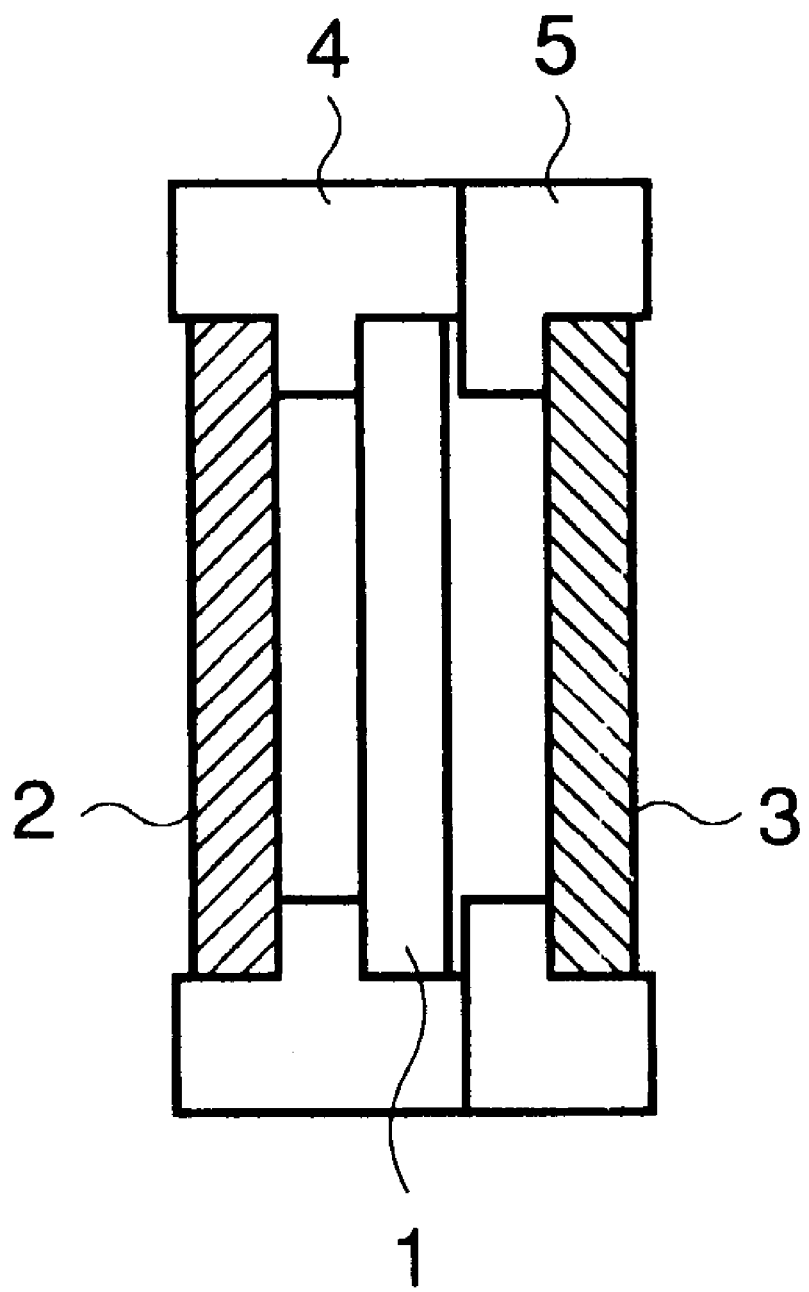
FIG. 3 illustrates an optical isolator for a wavelength of 1.3 μm manufactured using the Faraday rotator of the invention.

Then, an optical isolator for a wavelength of 1.31 μm as shown in FIG. 3 was manufactured using Faraday rotator 1. Referring to FIG. 3, Faraday rotator 1 is formed of the G-film-1 of 2 mm×2 mm size which has been magnetized in a magnetic field of 2,000 Oe at room temperature. A polarizer 2 is a polarizing element for a wavelength of 1.31 μm, made of glass and takes the form of POLARCORE (trade mark) commercially available from CORNING. An analyzer 3 is also a polarizing element for a wavelength of 1.31 μm made of glass and takes the form of POLARCORE (trade name). A metal jig 4 firmly holds the Faraday rotator, polarizer, and analyzer together. A metal jig 5 holds the analyzer 3. Faraday rotator, polarizer, and analyzer were fixed to the metal jigs 4 and 5 by epoxy adhesive. The metal jigs 4 and 5 were bonded together by epoxy adhesive, thereby providing an optical isolator.

Isolation was measured at temperatures from −40 to +70° C. with no external magnetic field applied to the optical isolator. The isolation was 26 dB or more in the temperature range from −10 to +40° C. and 21 dB or more in the temperature range from −40 to +70° C. The difference in isolation between the temperature ranges reflects the temperature dependence of Faraday rotation angle.

Then, the isolation of the optical isolator was measured at temperatures from −40 to +70° C. while applying a magnetic field of 100 Oe in a direction opposite to the direction in which the isolator was magnetized into saturation. The obtained isolation was equal to or greater than 26 dB at temperatures from −10 to +40° C. and equal to or greater than 21 dB at temperatures from −40 to +70° C.

Example 2

The following materials were placed in a platinum crucible of 2,000 ml capacity: 3,546 gm lead oxide (PbO, 4N), 3,733 gm bismuth oxide ($Bi_2O_3$, 4N), 448 gm ferric oxide ($Fe_2O_3$, 4N), 167 gm boron ($B_2O_3$, 5N), 46.0 gm terbium oxide ($Tb_2O_3$, 3N), 42.7 gm gallium oxide ($Ga_2O_3$, 3N), and 13.9 gm aluminum oxide ($Al_2O_3$, 3N).

The materials were heated to melt, thereby preparing a melt for growing bismuth-substituted rare earth iron garnet single crystals.

A $Tb_{1.58}Bi_{1.42}Fe_{4.06}Ga_{0.63}Al_{0.31}O_{12}$ single crystal film having a thickness of 530 μm (referred to as G-film-2) was fabricated in the same way as Example 1 except that the aforementioned melt was used.

The G-film-2 was polished to a thickness of 481 μm. The substrate of (111) garnet single crystal was removed during polishing. Then, an anti-reflection film for 1.55 μm is formed on the both sides of the G-film-2 to fabricate a Faraday rotator (referred to as Faraday rotator 2) for light having a wavelength of 1.55 μm. The magnetic properties of the film were examined as follow:

First, Faraday rotator 2 was placed at the center of an electromagnet at room temperature, the electromagnet applying a magnetic field of 3,000 Oe to Faraday rotator 2 in a direction normal to its film surface to magnetize it into saturation. After saturation, the magnetic field was reduced to zero but Faraday rotator 2 retained its Faraday rotation angle which was achieved when Faraday rotator 2 was magnetically saturated. The Faraday rotation angle was 44.2°.

Then, in order to investigate the nucleation field, Faraday rotator 2 was placed again in the center of the Helmholtz coil of the field generator so that a magnetic field was applied to Faraday rotator 2 in a direction opposite to the external magnetic field applied by the electromagnet. In other words, a test was conducted to determine a maximum external magnetic field under which the Faraday rotator can retain its magnetic saturation. Faraday rotator 2 retained its magnetic saturation under a maximum external magnetic field of 170 Oe at temperatures from −40 to +70° C.

Example 3

The following materials were placed in a platinum crucible of 2,000 ml capacity: 3,560 gm lead oxide (PbO, 4N), 3,716 gm bismuth oxide ($Bi_2O_3$), 4N), 459 gm ferric oxide ($Fe_2O_3$, 4N), 171 gm boron ($B_2O_3$, 5N), 45.9 gm terbium oxide ($Tb_2O_3$, 3N), and 58.0 gm gallium oxide ($Ga_2O_3$, 3N).

The materials were heated to melt, thereby preparing a melt for growing bismuth-substituted rare earth iron garnet single crystals.

The materials were heated to melt so as to prepare a melt for growing bismuth-substituted rare earth iron garnet single crystals.

A $Tb_{1.86}Bi_{1.14}Fe_{4.29}Ga_{0.71}O_{12}$ single crystal film having a thickness of 377 μm (referred to as G-film-3) was fabricated in the same way as Example 1 except that the aforementioned melt was used.

The G-film-3 was processed in exactly the same way as Example 1 to fabricate a Faraday rotator (referred to as Faraday rotator 3) having a thickness of 328 μm. Faraday rotator 3 was used for light having a wavelength of 1.31 μm. The magnetic properties of the film were examined. The saturation magnetic field was 176 Oe at +25° C. and reached a maximum of 248 Oe at temperatures from −40 to +70° C. The magnetic compensation temperature was −32° C.

Faraday rotator 3 was placed at the center of an electromagnet at room temperature and a magnetic field of 5,000 Oe was applied in a direction normal to the film surface so that the film was magnetically saturated. The magnetic field was reduced to zero after the G-film-3 had been magnetically saturated but the Faraday rotator 1 retained the Faraday rotation angle same as that when Faraday rotator 1 was saturated. Faraday rotator 3 was again placed in the Helmholtz coil to apply a magnetic field to determine the nucleation magnetic field. The magnetic field generated by the Helmholtz coil is in a direction opposite to the magnetic field applied by the electromagnet to Faraday rotator 3. In other words, a test was conducted to determine a maximum external magnetic field under which the Faraday rotator can retain its magnetic saturation. Faraday rotator 3 was found to have retained its magnetic saturation under a maximum magnetic field of 163 Oe in the temperature range from −40 to +70° C.

Comparison 1

The following materials were placed in a platinum crucible of 2,000 ml capacity: 3,561 gm lead oxide (PbO, 4N), 3,717 gm bismuth oxide ($Bi_2O_3$, 4N), 459 gm ferric oxide ($Fe_2O_3$, 4N), 171 gm boron ($B_2O_3$, 5N), 45.9 gm terbium oxide ($Tb_2O_3$, 3N), and 43.4 gm gallium oxide ($Ga_2O_3$, 3N).

The materials were heated to melt, thereby preparing a melt for growing bismuth-substituted rare earth iron garnet single crystals.

A $Tb_{2.01}Bi_{1.09}Fe_{4.44}Ga_{0.56}O_{12}$ single crystal film having a thickness of 413 μm (referred to as G-film-C1) was fabricated in the same way as Example 1 except that the aforementioned melt was used. The G-film-C1 was processed in exactly the same way as Example 1 to fabricate a Faraday rotator (referred to as Faraday rotator C1), which is used for a wavelength of 1.31 μm and has a thickness of 364 μm. The saturation magnetic field was 329 Oe at +25° C. and reached a maximum of 380 Oe in the temperature range from −40 to +70° C.

Faraday rotator C1 was placed at the center of an electromagnet in order to magnetically saturate Faraday rotator C1 by applying a magnetic field of 5,000 Oe in a direction normal to the film surface. The magnetic field was then reduced to zero after Faraday rotator C1 had been saturated. Faraday rotator C1 was found to have retained its magnetic saturation which was achieved when Faraday rotator C1 was saturated.

Faraday rotator C1 was again placed in the Helmholtz coil of the field generator so that a magnetic field was applied to the Faraday rotator C1 to determine nucleation magnetic field. The magnetic field applied to Faraday rotator was is in a direction opposite to the magnetic field applied by the electromagnet. In other words, a test was conducted to determine a maximum external magnetic field under which the Faraday rotator can retain its magnetic saturation. Faraday rotator C1 was found to have retained its magnetic saturation under a maximum magnetic field of 30 Oe in the temperature range from −40 to +70° C.

Comparison 2

Faraday rotator 1 obtained in Example 1 was placed at the center of an electromagnet in order to magnetically saturate Faraday rotator 1 by applying a magnetic field of 500 Oe in a direction normal to the film surface. The magnetic field was then reduced to zero after the Faraday rotator 1 had been saturated. Faraday rotator 1 retained magnetic saturation which was achieved when Faraday rotator 1 was saturated. Faraday rotator 1 was again placed in the Helmholtz coil to apply a magnetic field to determine nucleation magnetic field. The magnetic field generated by the Helmholtz coil was in a direction opposite to the magnetic field applied by the electromagnet to Faraday rotator 1. In other words, a test was conducted to determine a maximum external magnetic field under which the Faraday rotator can retain its magnetic saturation. The Faraday rotator 1 was found to have retained its magnetic saturation under a maximum magnetic field of 18 Oe in the temperature range from −40 to +70° C.

Comparison 3

The following materials were placed in a platinum crucible of 2,000 ml capacity: 3,560 gm lead oxide (PbO, 4N), 3,716 gm bismuth oxide ($Bi_2O_3$, 4N), 445 gm ferric oxide ($Fe_2O_3$, 4N), 171 gm boron ($B_2O_3$, 5N), 49.2 gm gadolinium oxide ($Gd_2O_3$, 3N), 4.45 gm aluminum oxide ($Al_2O_3$, 3N), and 54.6 gm gallium oxide ($Ga_2O_3$, 3N).

The materials were heated to melt, thereby preparing a melt for growing bismuth-stubstituted rare earth iron garnet single crystals.

A $Gd_{2.07}Bi_{0.93}Fe_{4.21}Ga_{0.68}Al_{0.11}O_{12}$ single crystal film having a thickness of 425 μm (referred to as G-film-C3) was fabricated in the same way as Example 1 except that the aforementioned melt was used.

The G-film-C3 was processed in exactly the same way as Example 1 to fabricate a Faraday rotator (referred to as Faraday rotator C3) for a wavelength 1.31 μm, having a thickness of 386 μm. The magnetic properties of the G-film-C3 were measured. The saturation magnetic field of Faraday rotator C3 was 155 Oe at +25° C. and reached a maximum of 439 Oe in the temperature range from −40 to +70° C. Magnetic compensation temperature was 58° C.

Faraday rotator C3 was then placed at the center of an electromagnet in an environment of room temperature and a magnetic field of 5,000 Oe was applied in a direction normal to the G-film-C3 surface so that the G-film-C3 was magnetically saturated. The magnetic field was reduced to zero after the G-film-C3 had been magnetically saturated but Faraday rotator C3 retained the same Faraday rotation angle as that when Faraday rotator C3 was magnetically saturated. However, Faraday rotator C3 entered its non-saturated state when it was cooled down to −25° C.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A Faraday rotator formed of a bismuth-substituted iron garnet single crystal film which is grown by a liquid phase epitaxial method and represented by a formula:

$$Tb_{3-x}Bi_xFe_{5-y-z}Ga_yAl_zO_{12}$$

wherein x has the range $1.1 \leq x \leq 1.5$, y+z has the range $0.65 \leq y+z \leq 1.2$, and z has the range $z \leq y$, wherein the single crystal film is subjected to a magnetization process where the single crystal film is magnetized by a first external magnetic field so that the single crystal film has a square magnetic hysteresis loop.

2. The Faraday rotator according to claim 1, wherein the first external magnetic field has a magnetic field strength of 1,000 Oe or higher, the first external magnetic field being applied in a direction normal to a surface of the bismuth-substituted rare earth single crystal film, and then removed after the bismuth-substituted rare earth single crystal film has been magnetized.

3. The Faraday rotator according to claim 1, wherein said square magnetic hysteresis loop is retained in the temperature range from −40 to +70° C.

4. The Faraday rotator according to claim 1, wherein the Faraday rotator exhibits a Faraday rotation angle after the magnetization process, the Faraday rotation angle being of the same polarity when the Faraday rotator is placed in a second external magnetic field equal to or less than 50 Oe, the second external magnetic field being in a direction opposite to the first external magnetic field.

5. An optical isolator incorporating a Faraday rotator according to claim 1, the optical isolator further comprising:

a polarizer; and an analyzer;

wherein the polarizer and analyzer being arranged so that the Faraday rotator is placed between the polarizer and analyzer.

* * * * *